(12) United States Patent
Hynecek et al.

(10) Patent No.: US 8,785,986 B1
(45) Date of Patent: Jul. 22, 2014

(54) BCMD IMAGE SENSOR WITH JUNCTION GATE FOR BACK SIDE OR FRONT SIDE ILLUMINATION

(75) Inventors: Jaroslav Hynecek, Allen, TX (US); Hirofumi Komori, San Jose, CA (US)

(73) Assignee: Aptina Imaging Corporation, George Town (KY)

( * ) Notice: Subject to any disclaimer, the term of this patent is extended or adjusted under 35 U.S.C. 154(b) by 70 days.

(21) Appl. No.: 13/337,851

(22) Filed: Dec. 27, 2011

Related U.S. Application Data

(60) Provisional application No. 61/438,759, filed on Feb. 2, 2011.

(51) Int. Cl.
*H01L 27/146* (2006.01)
(52) U.S. Cl.
USPC ....... 257/258; 257/222; 257/443; 257/E27.15
(58) Field of Classification Search
USPC .................................................. 257/222, 443
See application file for complete search history.

(56) References Cited

U.S. PATENT DOCUMENTS

| 4,901,129 | A | | 2/1990 | Hynecek |
| 5,142,346 | A | * | 8/1992 | Hynecek ........................ 257/258 |
| 5,424,223 | A | | 6/1995 | Hynecek |
| 5,625,210 | A | | 4/1997 | Lee et al. |
| 5,880,494 | A | * | 3/1999 | Watanabe ...................... 257/225 |
| 6,046,466 | A | * | 4/2000 | Ishida et al. .................. 257/258 |
| 6,657,665 | B1 | | 12/2003 | Guidash et al. |
| 2001/0000068 | A1 | * | 3/2001 | Isogai et al. .................. 257/443 |
| 2003/0090584 | A1 | * | 5/2003 | Goto ............................. 348/299 |
| 2008/0283886 | A1 | * | 11/2008 | Hynecek ....................... 257/292 |
| 2009/0153708 | A1 | * | 6/2009 | Hirota et al. .................. 348/294 |

* cited by examiner

*Primary Examiner* — A. Sefer (57) ABSTRACT

The invention describes the solid-state image sensor array and in particular describes in detail the junction gate BCMD pixel sensor array that can be used in the back side illuminated mode as well as in the front side illuminated mode. The pixels generally do not need addressing transistors and the reset is accomplished in a vertical direction to the junction gate, so no additional reset transistor is needed for this purpose. As a result of this innovation the pixel maintains large charge storage capacity when its size is reduced, has low noise due to the nondestructive charge readout, and no RTS noise. The pixel interface generated dark current is also drained to the gate, so the image sensor array operates with very low dark current noise even at high temperatures. The junction gate also serves as a drain for the overflow charge.

12 Claims, 8 Drawing Sheets

BCMD IMAGE SENSOR WITH JUNCTION GATE FOR BACK SIDE OR FRONT SIDE ILLUMINATION

CROSS REFERENCE TO RELATED APPLICATION

This application claims priority under 35 USC Sec. 119 (e)(1) of provision application No. 61/438,759 filed on Feb. 2, 2011.

BACKGROUND OF THE INVENTION

1. Field of the Invention

The disclosed invention relates to solid-state image sensors and more specifically to small pixel size junction gate BCMD image sensors that can be used in the back side illuminated mode as well as in the front side illuminated mode and which incorporate a vertical charge reset to the gate.

2. Description of Related Art

The typical image sensors sense light by converting impinging photons into electrons that are integrated (collected) in sensor pixels. After completion of the integration cycle collected charge is converted into a voltage, which is supplied to the output terminals of the sensor. In CMOS image sensors the charge to voltage conversion is accomplished directly in the pixels themselves and the analog pixel voltage is transferred to the output terminals through various pixel addressing and scanning schemes. The analog signal can also be converted on-chip to a digital equivalent before reaching the chip output. The pixels have incorporated in them a buffer amplifier, typically a Source Follower (SF), which drives the sense lines that are connected to the pixels by suitable addressing transistors. After charge to voltage conversion is completed and the resulting signal transferred out from the pixels, the pixels are reset in order to be ready for accumulation of new charge. In pixels that are using Floating Diffusion (FD) as the charge detection node, the reset is accomplished by turning on a reset transistor that conductively connects the FD node to a voltage reference, which is typically the pixel drain node. This step removes collected charge. However, it generates kTC-reset noise as is well known in the art. kTC noise has to be removed from the signal by the Correlated Double Sampling (CDS) signal processing technique in order to achieve the desired low noise performance. The typical CMOS sensors that utilize the CDS concept usually require four transistors (4T) in each pixel. An example of the 4T pixel circuit with pinned photodiode can be found in U.S. Pat. No. 5,625,210 to Lee, which patent is incorporated herein by reference.

Figure 1:
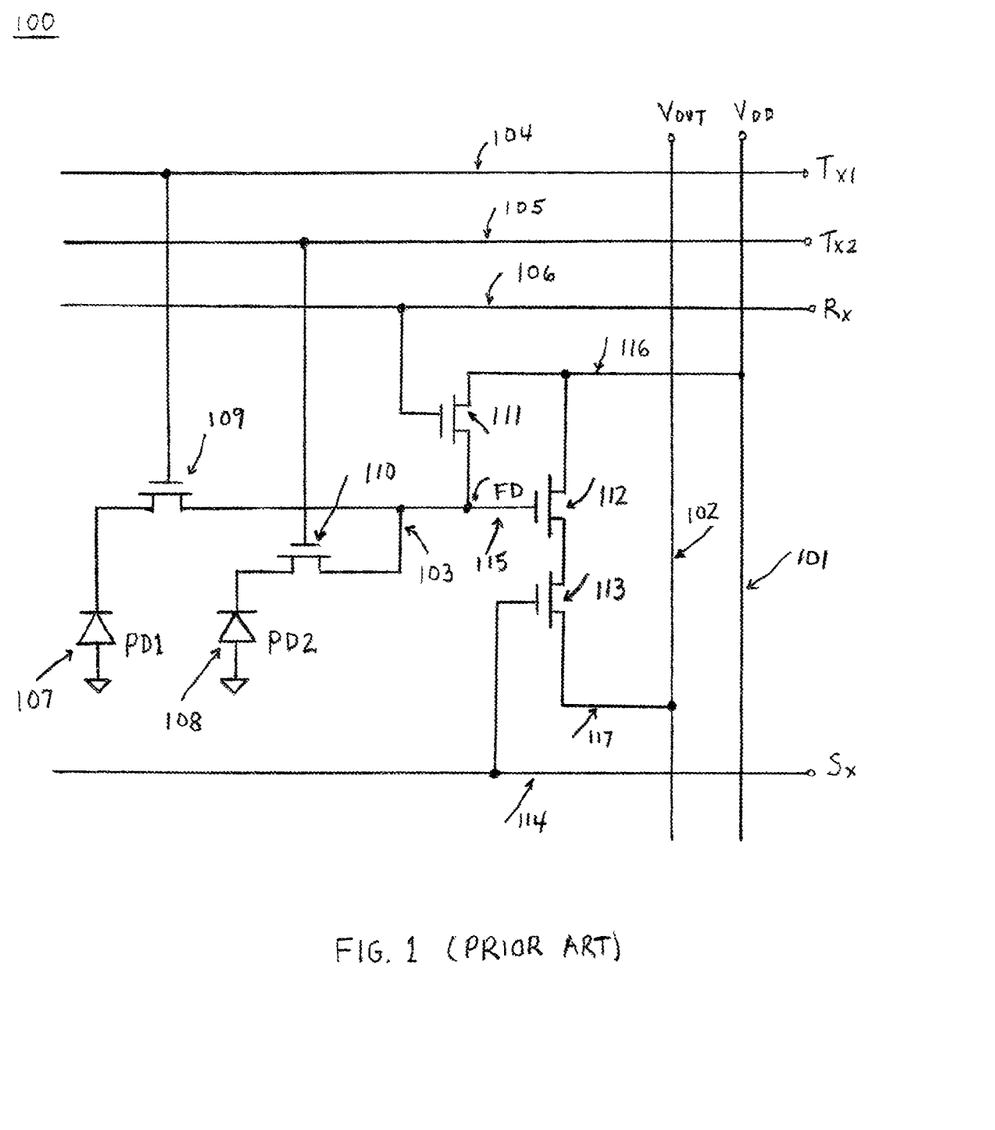
FIG. 1 shows a simplified schematic diagram of the prior art design of a row-shared pixel circuit with two pinned photodiodes per circuit that is operating on the 4T principle.

In modern CMOS sensor designs the circuitry for several photodiodes may be shared as can be found for example in U.S. Pat. No. 6,657,665 B1 to Guidash. In this patent the pixel consists of two photodiodes located in neighboring rows that share the same circuitry. Such shared circuit concept can result in having only two metal bus lines in the row direction and two metal bus lines in the column direction per photodiode as shown in FIG. 1. This is very useful for designing small pixels or pixels with high Fill Factor (FF) since the spacing and the width of the metal lines essentially determines the minimum pixel size. This is also illustrated in FIG. 1, where the drawing 100 represents the schematic diagram of a shared pixel circuit with two photodiodes 107 and 108. The photodiodes are coupled through charge transfer transistors 109 and 110 respectively to the common FD charge detection node 115. The FD node 115 is connected to the gate of the SF transistor 112 whose drain is connected via line 116 to the Vdd column bus line 101. The source of the SF transistor 112 is connected via the address transistor 113 and the line 117 to the output signal column bus line 102. The FD node is reset by the reset transistor 111 and its drain is connected to line 116. The control signals to the address transistor 113, the reset transistor 111, and charge transfer transistors 109 and 110 are supplied by the row bus lines 114, 106, 104 and 105 respectively. As can be seen from the schematic diagram of FIG. 1 the circuit that has two photodiodes thus consists of two row bus lines and two column bus lines per photodiode. However, in many cases it is also necessary to provide an additional connection between the elements of the circuit in the column direction as is illustrated by the wire 103. This further reduces the pixel Fill Factor (FF).

The large number of transistors in a pixel reduces the pixel charge storage capacity and also the quantum efficiency of photon conversion to electrons. It is therefore desirable to illuminate the sensor pixels from the back side of the substrate where no wiring is obstructing the illuminating light. However, the pixel well capacity, and thus its capability to store electrons, is still reduced when a larger number of transistors are used in the pixel. One advantage of using the BCMD concept is that only one MOS transistor is used for the pixel addressing, charge sensing including the signal buffering, and charge reset. A description of the BCMD concept can be found in U.S. Pat. No. 5,424,223 and U.S. Pat. No. 4,901,129 both to Hynecek, also incorporated herein by reference. In the BCMD pixel concept charge is stored under the MOS transistor channel and modulates the transistor threshold. The change in the threshold voltage is sensed when a current is directed to flow through this transistor. After charge sensing has been completed the pixel needs to be reset by removing collected charge without generating kTC noise. In the original MOS gate single transistor BCMD concept charge was removed from the pixel in a vertical direction to a silicon bulk by a suitable BCMD transistor gate bias. However, for the back side illuminated sensor configuration this vertical reset to bulk is a disadvantage, since the light sensitivity is reduced. The BCMD pixel using additional reset structure to provide charge reset in a lateral (horizontal) direction has been developed previously, which has an advantage in BSI applications. The BCMD lateral reset removes charge from the pixel completely without kTC noise generation, which is another advantage of this concept. The lateral reset is described in more detail in the above mentioned U.S. Pat. No. 5,424,223 to Hynecek. Unfortunately the pixel structure described in this patent increases the pixel size, which is a disadvantage when small pixels are needed for high resolution image sensors.

For this reason a different BCMD transistor and its reset concept is necessary that minimizes the pixel size while at the same time preserving all the advantages of the original BCMD device.

SUMMARY OF THE INVENTION

It is an object of the disclosed invention to overcome limitations in the prior art. It is the further object of the disclosed invention to provide a novel BCMD pixel design where the MOS gate of the typical BCMD device is replaced by a junction gate. Thus the novel BCMD transistor has a junction gate (JBCMD), which can be used for vertical charge reset resulting in high performance back side or front side illuminated image sensor arrays. Arrays using the JBCMD transistors have only one transistor per pixel. The novel JBCMD pixels have high charge storage capacity, nondestructive charge sensing, and a reset concept that does not generate kTC noise and does not cause the loss of light sensitivity when illuminated from the back side. This preserves all the advantages of the original MOS gate BCMD device that can now be used for the back side illuminated sensors as well as for the front side illuminated sensors. The vertical reset to the junction gate also provides the pixels with an efficient anti-blooming capability. These features allow one to build image sensor arrays with very small pixels and still preserve the high well capacity, low dark current, high Dynamic Range, and low noise features.

BRIEF DESCRIPTION OF THE DRAWINGS

The invention will be described in detail in the following description of the preferred embodiments with reference to the following figures wherein.

DESCRIPTION OF THE PREFERRED EMBODIMENTS

Figure 2:
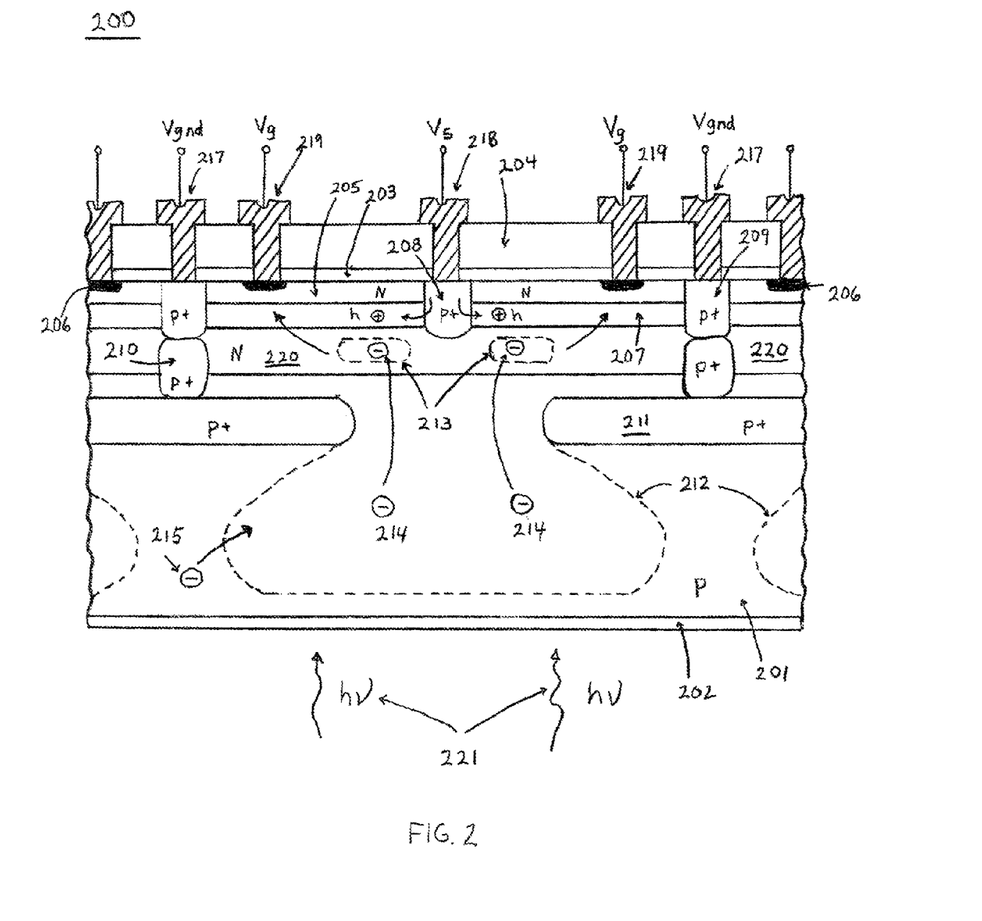
FIG. 2 shows a simplified cross section of a back side illuminated pixel with the junction gate BCMD transistor of the preferred embodiment. The location of the hole current and the location of the collected signal electrons are also shown.

In FIG. 2 the drawing 200 represents a simplified cross section of the back side illuminated (BSI) BCMD single pixel of the image sensor array of the present invention that utilizes a junction gate instead of an MOS gate. The pixels are fabricated on a p type substrate 201, preferably silicon that has a p+ type doping layer 202 on the bottom surface to minimize the dark current generation. The bottom surface of the entire array of pixels is exposed to the image illumination and may have color filters, micro-lenses, and various light shielding layers deposited thereon. The photons 221 enter the substrate 201 and create electrons 214, which then drift, under the influence of the electric field generated by the transistor bias, into the wells 213 where they are temporarily stored. The electrons 215 that are generated in the un-depleted regions first diffuse into the depletion region across boundaries 212 from where they are also swept into the wells 213. The stored electrons modulate the threshold of the BCMD transistor, which is built in the substrate 201. The transistor consists of the gate oxide layer 203 that covers the entire surface of the pixel array and serves as isolation. An additional layer of oxide 204 may be deposited on the substrate surface. An n type doped diffused region 205 forms the junction gate, which is shaped into rings surrounding the p+ type doped source 208. The transistor drain is another p+ type doped region 209, which fills the rest of the pixel area and all the remaining regions between the pixels in the array to isolate the pixels from each other. The isolation is extended deeper into the bulk by implanted p+ doped regions 210. The transistor channel current consists of holes that flow from the p+ type doped source 208 to the drain 209 when the gate 205 is suitably biased. The transistor channel is comprised of the p type doped region 207. Under the p type doped region 207 is another n type doped region 220 that contains the electron wells 213 in the form of doughnut shaped regions in each pixel. The electrical contacts to the various transistor regions are provided by the metal wiring plugs 217 to p+ doped regions 209, which are biased at ground potential, by the wiring plugs 219 to the gate region 205, and by the wiring plug 218 to the source region 208. The wiring plugs 219 are connected to the gate region 205 through n+ type doped regions 206. This is necessary for making a good ohmic connection to the gate region 205 since the gate region 205 cannot be heavily n type doped to prevent a premature breakdown to p+ type doped regions 209. Additional pixel separation is accomplished by the p+ type doped regions 211 located deeper in the substrate 201. These regions 211 are necessary to minimize the pixel cross talk and at the same time to provide a potential reference biased at ground when the pixel is reset by applying a high bias to the gate region 205.

Figure 3:
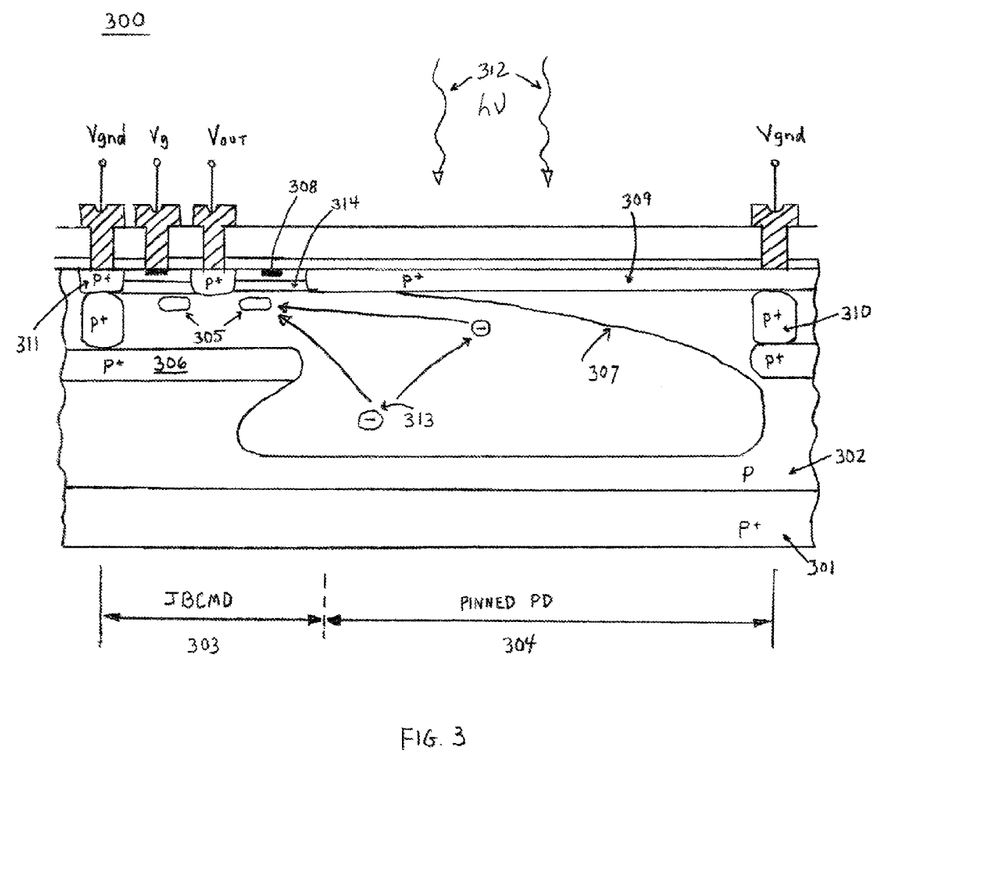
FIG. 3 shows a simplified cross section of the front side illuminated junction gate BCMD pixel, which is adjacent to a pinned photodiode. In this embodiment electrons are not stored in the pinned diode PD, but flow directly into the electron storage wells under the junction gate BCMD channel. The location of the collected signal electrons is shown in this drawing.

Another embodiment of the invention is shown in FIG. 3. The simplified drawing 300 of a device cross section is showing the junction gate BCMD 303 adjacent to a pinned photodiode 304. The pixel is front side illuminated and built in a p type doped epitaxial layer 302 deposited on the p+ type doped substrate 301. The pinning layer 309 is an extension of the P+ doped BCMD drain 311 and it is important for the reduction of the surface generated dark current. The BCMD hole current channel 314 is located below the n type doped gate which has a n+ type doped region 308 in it to provide a good ohmic contact to the gate. The pixels are separated by the isolation implant 310 and another deep p+ doped layer 306 is placed under the BCMD device to provide the potential reference during the reset. When photons 312 illuminate the pinned photodiode 304, electrons 313 are generated and drift into the electron storage wells 305 under the BCMD transistor channel 314. The depletion region of the pinned photodiode and the BCMD device is delineated by the boundary 307. In this embodiment the electrons are not stored in the PD. Instead they are accumulated and stored in the BCDM storage wells 305.

In another embodiment of the front side illuminated pixel, not shown in the drawing 300, it is possible to place an MOS transfer gate between the PD and the BCMD device and store charge in the PD during the charge integration period. By pulsing the transfer gates of the entire pixel array simultaneously, it is possible to transfer charge to the BCMD devices at the same instant and thus implement the Global Shuttering function. The BCMD devices can then be scanned in a sequential fashion as is common when the standard array is operated in a rolling shutter mode. There are many other possible configurations for the BCMD charge detectors and the pinned photodiodes to form various pixels where the BCMD detectors can be shared among several PD, but this is well known to those skilled in the art and does not have to be discussed here any further. The important point is that in this embodiment the pixel incorporating the BCMD charge detector does not need the row select transistor even though one can easily be incorporated into it and does not need a reset transistor, which saves valuable pixel area, reduces the pixel size and thus the image sensor array cost while maintaining the performance.

One of the key advantages of the BCMD pixel with the junction gate is that the dark current generated at the silicon-silicon dioxide interface is not collected in the electron wells 305 of FIG. 3 or electrons wells 214 of FIG. 2 and does not mix with the optically generated signal. Instead, the interface generated charge flows directly to the junction gate and out through the gate drivers to the power supply. This improves the image sensor performance particularly at low light levels and particularly when the device must operate at high temperatures.

Another advantage of the junction gate BCMD device is that the anti-blooming feature is also automatically built in. When the electron charge wells are full and start to overflow, the excess charge flows again to the gates of the oversaturated pixels and out to the power supply. No contamination of neighboring pixels by the unwanted blooming charge can thus occur.

Figure 4:
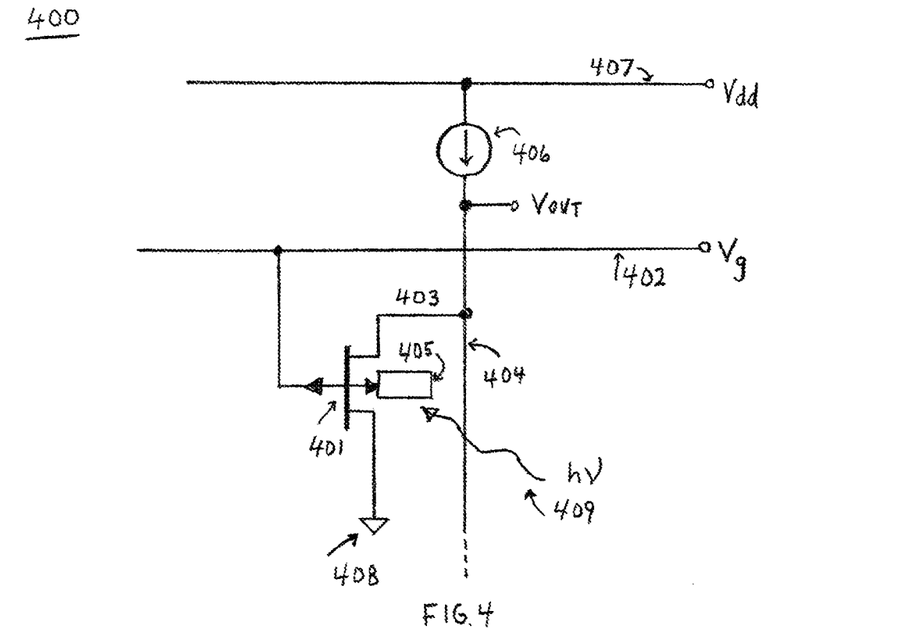
FIG. 4 shows a simplified schematic diagram of the equivalent junction gate BCMD pixel circuit and how it can be incorporated as one possible embodiment into the image sensor array.

For more clarity an equivalent circuit diagram of the junction gate BCMD pixel 400 is shown in FIG. 4. The horizontal (row) address signal is applied to the gate of the transistor 401 using the row bus line 402. The output signal, after the pixel row is selected, appears on the source 403 of the transistor 401. This signal drives the column line 404 to which all the remaining not addressed transistors are connected. The column line 404 is biased by a current source 406 from the power supply line 407. The charge reset is accomplished by biasing the row select line 402 high. When photons 409 enter the device substrate the generated electrons are collected in the transistor well 405. The reset causes removal of all the collected electrons without generation of kTC noise, which is one of the advantages of the BCMD concept. The drain of the transistor 401 is connected to ground through the connection 408, which can be located directly in the device substrate or may be a separate buss line connected to ground outside of the pixel array. The separate buss line connection to ground is necessary when the back of the substrate is biased to a different bias than the ground potential and is separated from the p+ top ground contact by a vertical current blocking implant.

Figure 5:
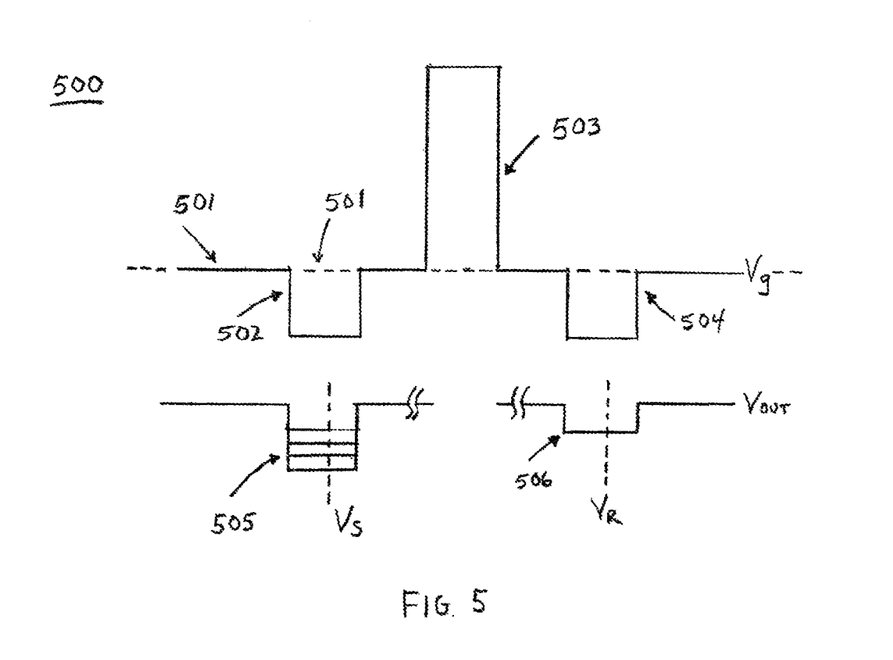
FIG. 5 shows the timing diagram of one possible timing scheme for one embodiment of the back side illuminated junction gate BCMD pixel operation.

An example of the timing pulses that the junction gate BCMD pixel can use for its operation is shown in a timing diagram 500 in FIG. 5. The line 501 represents the signal that is applied to the gates of the BCMD transistors in not selected rows during the signal readout interval. The selected row bias is pulsed low by pulse 502 while all other not selected rows are held biased at the level 501. During the reset interval the pulse 503 is applied to the selected row, which removes the collected charge from the pixel. After that the selected row pixels are pulsed again by pulse 504 to obtain the empty pixel reference. The output signal 505 is then subtracted from the empty pixel signal 506 in the array peripheral signal processing circuits. A number of various signal processing schemes can be used with this pixel such as the analog CDS processing followed by the column ADC conversion to a digital equivalent as is well known to all those skilled in the art.

Figure 6:
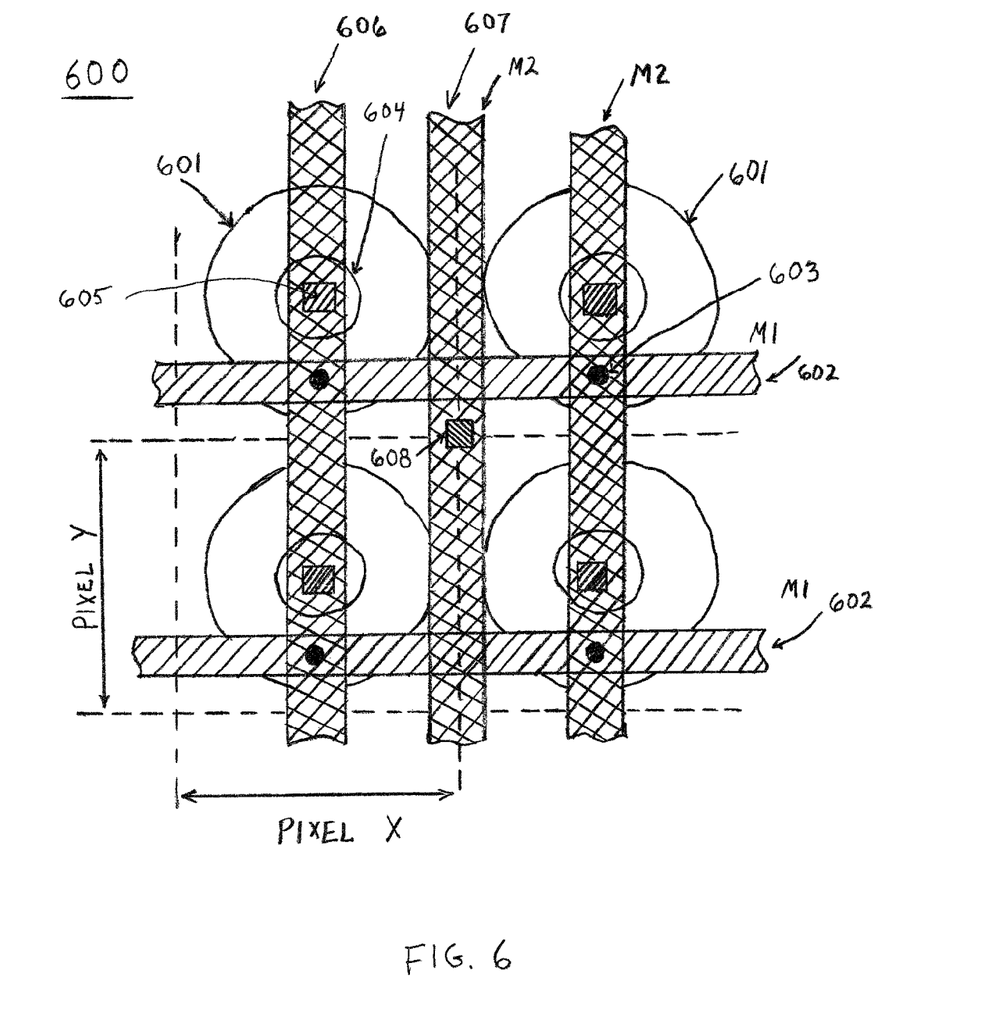
FIG. 6 shows a group of 2×2 junction gate BCMD pixels in one possible arrangement in the image sensor array that is illuminated from the back side. This pixel configuration is suitable for the Bayer color filter scheme.

In FIG. 6 a simplified drawing 600 of the top view of one possible embodiment of a 4×4 pixel section of the junction gate BCMD BSI image sensor array is shown. The circle 601 represents the external boundary of the n type doped junction gate that interfaces with the p type doped drain regions that fill the rest of the image area surface. The contact 608 to this region provides the ground connection via the column bus line 607. The source region is delineated by the circle 604 and is connected to the column output bus line 606 via the contact 605. Column bus lines are formed using the second level metal. The first level metal forms row addressing bus lines 602 that are connected to the junction gates via the contacts 603. The wiring of this device is very simple resulting in a compact layout with small pixel sizes. This arrangement is suitable for the Bayer color filter arrangement where the filters can be placed together with micro-lenses on the back side of the sensor aligned to the BCMD devices on front of the sensors. Additional light shielding layers can also be placed on the back side (illuminated side) of the sensor that can reduce the color cross talk.

Figure 7:
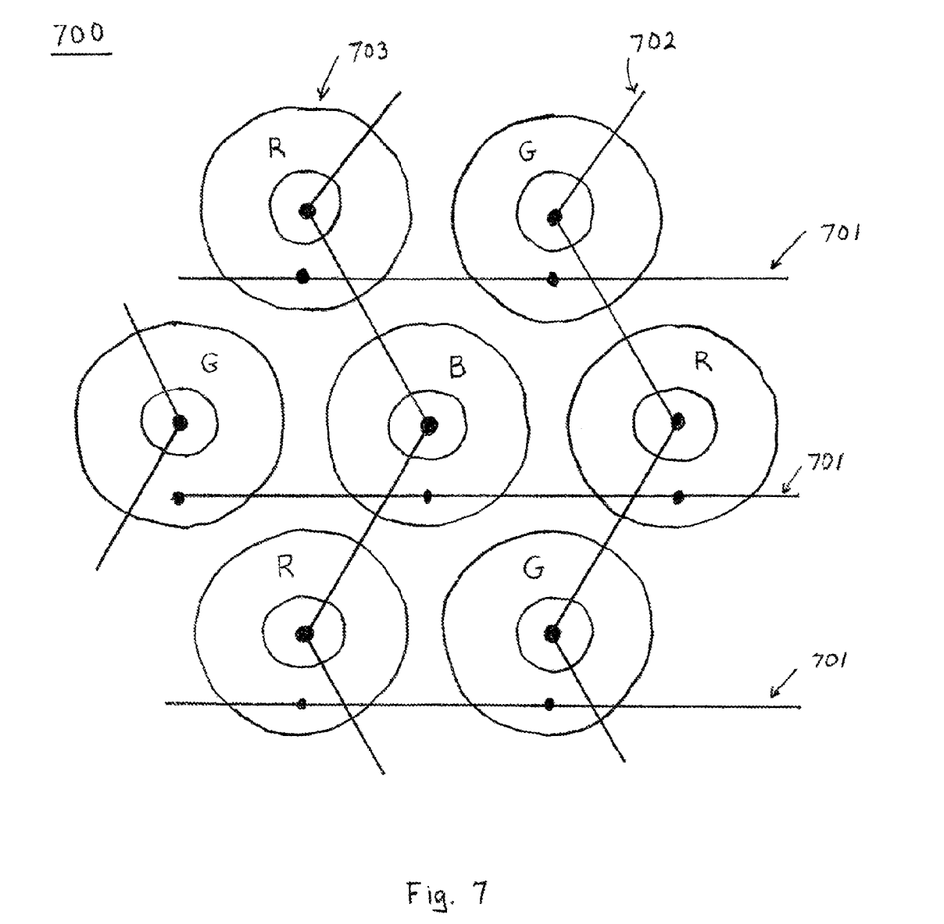
FIG. 7 shows another embodiment of a possible pixel layout, which is compact and has an advantage for color sensing since it provides even focal plane sampling for each color. This minimizes the color aliasing while maintaining resolution.

Another embodiment of the invention is show in FIG. 7 where the simplified drawing 700 illustrates a top view of the junction gate BCMD pixel arrangement in a back side illuminated array. This arrangement is more compact than the standard Bayer filter arrangement shown in FIG. 6. The RGB color filters are evenly spaced and sample the image plane evenly resulting in minimum color aliasing. One possible pixel wiring is shown only schematically. The BCMD junction gates are the circles 703. The pixel output signal appears on the column bus lines 702. The row addressing bias is supplied to the pixel via the row bus lines 701.

Figure 8:
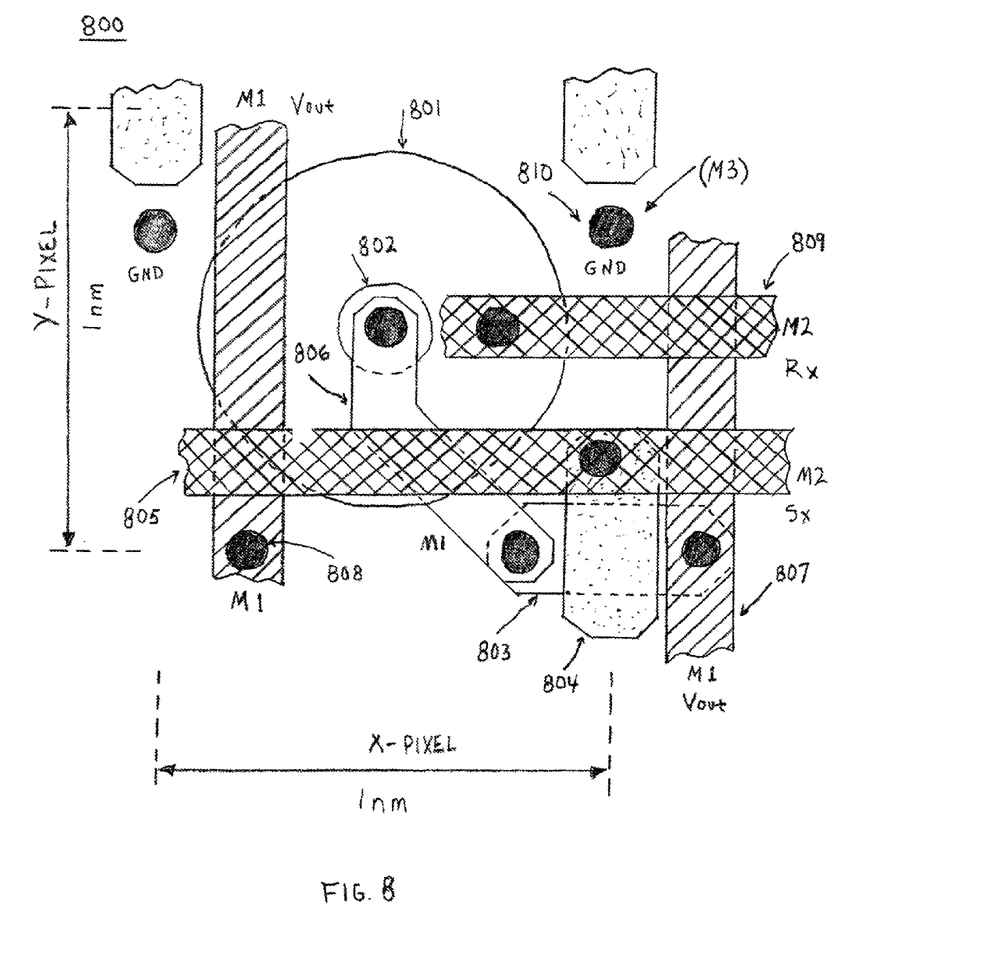
FIG. 8 shows a simplified top view of the pixel topology of the JBCMD pixel that also contains the row addressing transistor. Some of the metal line interconnections are also shown.

An additional embodiment of the invention that uses the row select transistor is shown in FIG. 8, where the simplified top view of the pixel 800 is drawn. The geometry 801 represents the outer edge on the junction gate and the geometry 802 represents the inner edge also defining the p+ source of the junction gate BCMD transistor. The gate of the JBCMD transistor is biased through the row gate bias line 809 which is formed by the metal two layer. The source of the JBCMD transistor is connected to the source of the n− channel row select transistor 803 by the metal one interconnect 806. The drain of the row select transistor is connected to the column sense line 807 formed also by the metal one layer. The gate of the row select transistor is formed by a polysilicon layer 804 that is connected to the row select bus line 805 formed from the metal two layer. The ground contact 810 is connected to the metal three layer that is not shown in the drawing. The contact vias are connecting the device components to the metal lines and are indicated in the drawing by the circles 808.

Figure 9:
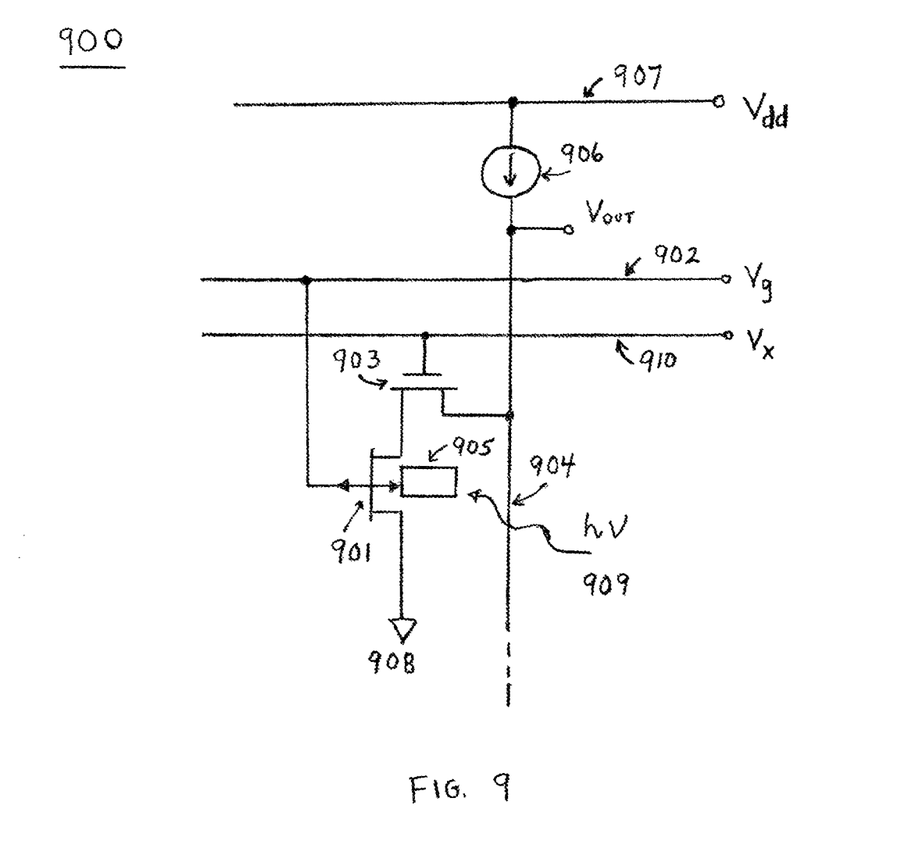
FIG. 9 is a simplified circuit diagram of the equivalent JBCMD pixel with the row addressing transistor showing how it can be incorporated into an image sensor array.

The equivalent simplified circuit diagram of the JBCMD pixel with the row addressing transistor is shown in the drawing 900 in FIG. 9. The drain of the JBCMD transistor 901 is connected to ground 908 and the source is connected to the source of the row select transistor 903. The gate of the row select transistor 903 is connected to the row addressing bus 910 that supplies the appropriate row select pulses. The drain of the row select transistor 903 is connected to the column signal bus line 904. The column signal bus line 904 is also connected at the periphery of the array to the column current source 906 that provides the current bias from the Vdd power supply bus 907 to the source of the JBCMD transistor 901 when the row select transistor 903 is turned on. The photon generated electrons 909 accumulate in the JBCMD transistor well 905 and after sensing they are reset to the JBCMD gate by applying the reset pulse to the row bus line 902.

There are many modifications possible to the invention and to the particular embodiments described by the above drawings. This is well known to all those skilled in the art. However, the key and main points of this invention that are novel are: the junction gate BCMD device that can be used in the BSI applications as well as in the FSI applications, vertical reset to the junction gate, and built in anti-blooming capability. Additional advantages are the compact layout, particularly in the BSI applications, large well capacity, low dark current that is free of the interface state generated contribution, which makes it possible to operate this device at high temperatures with low noise, and no RTS noise.

Having thus described the preferred embodiments of the novel pixel for the image sensor array with the back side illumination sensing capability and the vertical charge reset, which are intended to be illustrative and not limiting, it is noted that persons skilled in the art can make modifications and variations in light of the above teachings. It is therefore to be understood that changes may be made in the particular embodiments of the invention disclosed, which are within the scope and spirit of the invention as defined by the appended claims.

Having thus described the invention with the details and particularity required by the patent laws, what is claimed and desired protected by Letters Patent is set forth in the appended claims.

What is claimed is:

1. A BCMD image sensor pixel array, comprising:
   a plurality of pixel circuits, wherein each pixel circuit of the array comprises:
      a BCMD transistor formed near the surface of a silicon substrate, wherein said BCMD transistor includes a junction gate, wherein charge reset is accomplished in a vertical direction to the junction gate, wherein said junction gate also serves as a drain for any overflow charge, whereby a built in anti-blooming capability is provided, and wherein said pixel is configured to be responsive to illumination from the front side of the silicon substrate;
   peripheral circuitry; and
   a pinned photodiode interfacing with said BCMD transistor with a junction gate, wherein charge generated from said front side illumination is not stored in said pinned photodiode but flows directly from said pinned photodiode to a BCMD storage well as it is being generated.

2. The BCMD image sensor pixel array of claim 1 wherein BCMD transistors with junction gates, from neighboring pixels, are aligned in a 2×2 pattern suitable for a Bayer pattern filter arrangement.

3. The BCMD image sensor pixel array of claim 1 wherein BCMD transistors with junction gates, from neighboring pixels, are aligned in a triangular compact pattern with even focal plane pixel sampling density for each RGB color.

4. The BCMD image sensor array of claim 3 that includes color filters and micro-lenses.

5. A BCMD image sensor pixel array, comprising:
   a plurality of pixel circuits, wherein each pixel circuit of the array comprises:
      a BCMD transistor formed near the surface of a silicon substrate, wherein said BCMD transistor includes a junction gate, wherein charge reset is accomplished in a vertical direction to the junction gate, wherein said junction gate also serves as a drain for any overflow charge, whereby a built in anti-blooming capability is provided, and wherein said pixel is configured to be responsive to illumination from the front side of the silicon substrate;
   peripheral circuitry; and
   a pinned photodiode interfacing with the BCMD transistor with a junction gate, wherein charge generated from said front side illumination is stored in said pinned photodiode;
   said stored charge thereafter being transferred into a BCMD charge storage well, whereby a global shutter mode of operation may be implemented.

6. The BCMD image sensor pixel array of claim 5 wherein said BCMD transistor is connected to an output signal column bus through a row select transistor.

7. The BCMD image sensor pixel array of claim 5 wherein BCMD transistors with junction gates, from neighboring pixels, are aligned in a 2×2 pattern suitable for a Bayer pattern filter arrangement.

8. The BCMD image sensor pixel array of claim 5 wherein BCMD transistors with junction gates, from neighboring pixels, are aligned in a triangular compact pattern with even focal plane pixel sampling density for each RGB color.

9. The BCMD image sensor array of claim 8 that includes color filters and micro-lenses.

10. A BCMD image sensor pixel array, comprising:
    a plurality of pixel circuits, wherein each pixel circuit of the array comprises:
       a BCMD transistor formed near the surface of a silicon substrate, wherein said BCMD transistor includes a junction gate, wherein charge reset is accomplished in a vertical direction to the junction gate, wherein said junction gate also serves as a drain for any overflow charge, whereby a built in anti-blooming capability is provided, and wherein said pixel is configured to be responsive to illumination from the front side of the silicon substrate;
    peripheral circuitry; and
    a plurality of pinned photodiodes interfacing with said BCMD transistor with a junction gate, said pinned photodiodes being responsive to front side illumination and having a capability to store charge therein;
    said charge stored in said plurality of pinned photodiodes being transferred by into a BCMD charge storage well, whereby a global shutter mode of operation may be implemented.

11. The BCMD image sensor pixel array of claim 10 wherein said BCMD transistor is connected to an output signal column bus through a row select transistor.

12. The BCMD image sensor array of claim 10 that includes color filters and micro-lenses.

* * * * *